United States Patent [19]
LeRoux

[11] Patent Number: 5,821,752
[45] Date of Patent: Oct. 13, 1998

[54] REAL-TIME RF PULSE CONSTRUCTION FOR NMR MEASUREMENT SEQUENCES

[75] Inventor: Patrick L. LeRoux, Les Quinconces, France

[73] Assignee: General Electric Company, Waukesha, Wis.

[21] Appl. No.: 683,589

[22] Filed: Jul. 15, 1996

[51] Int. Cl.$^6$ .................................................. G01R 33/20
[52] U.S. Cl. ............................................................ 324/314
[58] Field of Search ................................... 324/300, 307, 324/309, 318, 303; 128/653.2, 653.3; 600/410

[56] References Cited

U.S. PATENT DOCUMENTS 4,940,940  7/1990  LeRoux .................................. 324/309

OTHER PUBLICATIONS

*Reduced Power Selective Excitation Radio Frequency Pulses*, MRM 32:658–660 (1994), Meir Shinnar.

*Pulses with Fixed Magnitude and Variable Phase Response Profiles*, MRM 33:648–655 (1995), S. Puckup & X. Ding.

*A Weighted Least Squares Algorithm for Quasi–Equiripple FIR and IIR Digital Design*, IEEE Transaction on Signal Processing, pp. 551–558, vol. 40, No. 3, Mar. 1992, Yong et al.

*Primary Examiner*—Sandra L. O'Shea
*Assistant Examiner*—Michael Eisenberg
*Attorney, Agent, or Firm*—Quarles & Brady

[57] ABSTRACT

An RF pulse for an NMR pulse sequence is designed in the NMR system using an inverse SLR transformation method. The polynomials required for the SLR transformation are calculated using a weighted least mean squares ("WLMS") process in which an initial weighting function is employed along with the desired pulse profile that is input by the NMR system operator. The operator can also specify the phase profile as an input to the WLMS process.

6 Claims, 4 Drawing Sheets

REAL-TIME RF PULSE CONSTRUCTION FOR NMR MEASUREMENT SEQUENCES

BACKGROUND OF THE INVENTION

The field of the invention is nuclear magnetic resonance methods and systems. More particularly, the invention relates to the design of RF pulses used in nuclear magnetic resonance ("NMR") spectroscopy and magnetic resonance imaging ("MRI") pulse sequences.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to an RF magnetic field (excitation field $B_1$) which is in the x–y plane and which is near the Larmor frequency, the net aligned moment, $M_z$, may be rotated, or "tipped", into the x–y plane to produce a net transverse magnetic moment $M_t$. A signal is emitted by the excited spins, and after the RF excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

There are numerous pulse sequences used in MRI and in NMR spectroscopy. These pulse sequences use at least one, and usually more than one, RF pulse near the Larmor frequency. In addition to the RF excitation pulse mentioned above, such RF excitation pulses may, for example, invert spin magnetization, saturate spin magnetization, stabilize spin magnetization or refocus spin magnetization. When used in combination with a magnetic field gradient, the RF pulses selectively affect spin magnetization over a specific frequency range which corresponds to a specific location within the subject being scanned. Such "selective" RF pulses are thus specified by the degree to which they tip magnetization ("flip-angle") over a range of frequencies.

In my prior U.S. Pat. No. 4,940,940 I disclose a method for designing RF pulses that will produce a desired flip-angle over a specified frequency range. This method, known in the art as the "SLR" method, starts with the desired frequency domain pulse profile (for example, a 90° flip-angle over a specified slice thickness/frequency range) and calculates the amplitude of an RF pulse, that when played out over time, will produce the desired result. These calculations involve the approximation of the desired frequency domain pulse profile with two high order polynomials A and B which can then be transformed directly into an RF pulse that is "played out" on an NMR system. The step of producing the polynomials A and B employs a Remez (Park-McClellan) algorithm that is executed in an iterative process. To calculate the necessary A and B polynomials (hereinafter referred to as the "SLR polynomials") this iterative process is performed until the desired frequency domain pulse profile is approximated to a specified degree of accuracy. This is time consuming and calculation intensive.

There are instances in which it is desirable to design RF pulses that are customized for the prescribed pulse sequence. One such situation occurs when so-called "presaturation" RF pulses are to be employed to saturate spins on both sides of a region of interest as described in U.S. Pat. No. 4,715,383. A single RF saturation pulse can be produced which saturates spins located on opposite sides of the image "slab", but the precise location of these two saturation regions is determined by the location and thickness of the image slab which is known only at the time of the scan when the operator enters this information. It is desirable to design the RF saturation pulse after the system operator has entered the precise image slab location and thickness so that the saturation regions will be substantially contiguous with the image slab, but will not interfere with spin magnetization in the image slab.

SUMMARY OF THE INVENTION

The present invention is a method for producing an RF pulse in response to a specified RF pulse profile. More specifically the desired pulse profile $des(\omega)$ is input, a weighting function $W(\omega)$ is calculated, a set of SLR polynomials are calculated using a weighted least mean squares process having as inputs the desired pulse profile $des(\omega)$ and the weighting function $W(\omega)$, and the SLR polynomials are employed in an inverse SLR process to produce an RF pulse waveform $R(t)$. The RF pulse may be produced in the MRI system in response to an RF pulse profile specified by the operator prior to a scan which uses the RF pulse.

In addition to specifying the magnitude of the excitation as a function of frequency, the RF pulse profile specification may also include a phase specification. In such case, the phase specification is also input to the weighted least means squares process and that process may be repeated one or more times to satisfy the desired magnitude specification.

GENERAL DESCRIPTION OF THE INVENTION

Figure 1:
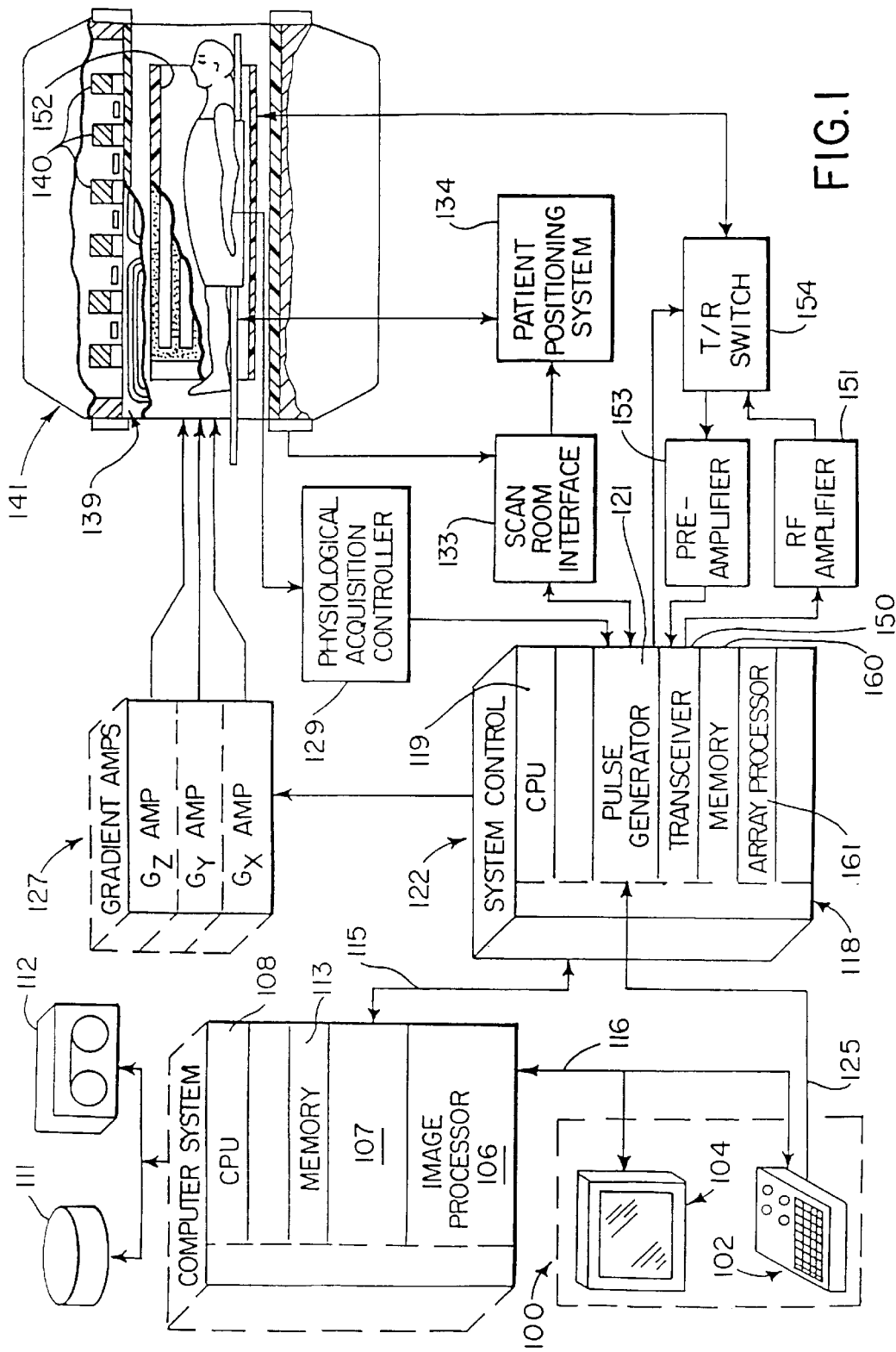
FIG. 1 is a block diagram of an MRI system which employs the present invention.

The problem addressed by the present invention is the "design" of a pair of complex SLR polynomials which result in a flip-angle magnitude profile which best approximates the desired profile while providing a minimum amount of ripple in both the selected and nonselected regions. The primary objective is to design such SLR polynomials quickly, and when possible, in a non-iterative way.

It is recognized that the design of SLR polynomials can be analogized to the design of finite impulse response ("FIR") filters, where the frequency response of the FIR filter corresponds to the desired frequency domain pulse profile and the filter coefficients correspond to the SLR polynomials. One method for designing the FIR filter coefficients is referred to in the art as the weighted least mean squares ("WLMS") technique.

If $\hat{H}(\omega)$ and $H(\omega)$ are the desired frequency response and actual frequency response of an FIR filter, respectively, then the approximation error at frequency $\omega$ is given by:

$$E(\omega)=H(\omega)-\hat{H}(\omega). \tag{1}$$

Min-max design corresponds to minimizing the weighted peak error $|E(\omega)/W(\omega)|$ over all $\omega$ where $W(\omega)$ is a prescribed weighting function. Least squares design corresponds to minimizing $$\int_{-\pi}^{\pi} |\epsilon(\omega)|^2 d\omega.$$

The design of digital filters which are optimum in the min-max sense requires the use of sophisticated optimization tools such as the Remez exchange algorithm or linear programming. On the other hand, the weighted least squares method is well known and can be easily written in short computer codes. Furthermore, for any given least mean squares weighting function, the optimum solution can be obtained in a non-iterative process. The weighted least squares technique will produce an equiripple design if a suitable least squares frequency response weighting function is used. It has also been demonstrated that the weighted least mean squares technique can be used to design high order FIR filters in the discrete coefficient space.

The success of equiripple design using the weighted least mean squares technique depends on the availability of the least mean squares weighting function $W(\omega)$. Using the method described by Y. C.

Lins, et al. in "A Weighted Least Squares Algorithm for Quasi-Equiripple FIR and IIR Digital Filter Design," *IEEE Transactions on Signal Processinq*, vol. 40, No. 3, Mar. 1992, the following weighting function has been derived:

$$W(\omega) = (1 + 10 \times W\,cor(\omega))/\delta^2(\omega) \tag{2}$$

$$Wcor(\omega) = \sum_i \frac{1}{|\omega - \omega_{oi}|^2}$$

($\delta(\omega)$) is the desired min-max error sought for a particular "reduced" angular frequency and $\omega_{oi}$ denotes the position of the centers of the transition bands. This weighting function $W(\omega)$ may then be used in the WLMS algorithm:

$$\min J(B) = \int_o^{2\pi} W(\omega)\|B(\omega) - des(\omega)\|^2 d\omega \tag{3}$$

where:

$$B(\omega) = \sum_{i=0}^{i=n-1} b_i Z^{-1}$$

$$Z = e^{j\omega}$$

where $des(\omega)$ is the desired pulse profile.

If the phase $\phi$ of the desired pulse profile is also specified ($\phi(\omega)$), the desired pulse profile is defined as follows:

$$des(\omega)=ampli(\omega)l^{j\phi(\omega)} \tag{4}$$

The results are disappointing if this specification is used directly in equations (3), however, good amplitude and phase results have been obtained by specifying phase in the following manner:

$$t(\omega)\frac{d\phi(\omega)}{d\omega} \tag{5}$$

$$\tau(\omega) = \tau_d(\omega)*\tau_o(\omega)$$

$$\tau_0(\omega) = \left(\frac{1}{1-\gamma Z^{-1}} + \frac{\gamma Z}{1-\gamma Z}\right) - 1$$

$Y=1-2\pi/n$ $-n/2<\tau_d(\omega)<n/2$ in pass bands $\tau_d=0$ elsewhere n=length of FIR filter $\tau$=group delay

*=convolution operation $\tau_o$=group delay of a zero at radius Y

The value of Y used is the radius where the zeros of a FIR filter of length n always stand, approximately. The overall action of equation (5) is to smooth the desired group delay $\tau_d$ by the typical group delay of a zero, thus approximating the phase of a FIR filter of length n.

When the phase is also specified for the desired pulse profile, the WLMS approximation of equation (3) may not be accurate enough using one iteration. In this case, an iterative procedure in which the specified phase $\phi(\omega)$ in equation (4) is replaced by the phase of $B(\omega)$ obtained by the last iteration of equation (3), and the WLMS calculation in equation (3) is repeated. The solution produces SLR polynomials that rapidly converge to a pulse design which is equiripple and whose phase is close to the initial desired phase $\phi(\omega)$.

One application of the invention in which the phase is specified is the production of a so-called "quadratic-phase" RF pulse. If the phase $\phi(\omega)$ varies as a quadratic function of frequency across the specified pulse profile, the RF power required in the resulting RF pulse is distributed more evenly throughout its duration. As a result, the required peak RF power of the RF transmitter is reduced. Since peak RF power is a limiting factor in some MRI systems, the ability to design RF pulses that produce the desired pulse profile without exceeding the peak power capability of the MRI system is important.

The polynomials may then be increased in order to produce the order of SLR polynomials required for the final RF pulse. This may be accomplished using an interpolation process which permits the design of polynomials having a typical order of 32 to produce polynomials of order 256 or more for use in the SLR inversion.

$$B'(\omega)=B(\omega)*\text{Spline}(\omega) \tag{6}$$

The influence of the spline interpolation can be taken into account and corrected for in the passbands by premultiplying $des(\omega)$ with $1/\text{spline}(\omega)$ before the WLMS design.

The SLR polynomials are then used in an inverse SLR transformation process to produce the RF pulse samples $R(t)$ that can be played out by the MRI system to produce the desired RF pulse. The SLR transformation is described in U.S. Pat. No. 4,940,940, issued on Jul. 10, 1990, and which is incorporated herein by reference. The last nutation angle $\theta_n$ ($R(nT)$, where T is the sampling period) is obtained by:

$$\text{TANG}(0.5*\theta_n)=t_n=b_n^{\,0}/a_n^{\,0}$$

where:

$b_n^{\,0}$ is the coefficient of order 0 of the polynomial $B_n$ $a_n^0$ is the coefficient of order 0 of the polynomial $A_n$, and $$A_{n-1} = A_n + t_n * B_n \quad (7)$$
$$B_{n-1} = Z(-t_r A_n + B_n)$$

$A_{n-1}$ and $B_{n-1}$ are polynomials of order (n−1), representing the rotation induced by the RF pulse train up to the n−1 pulse. By recursion, one can find all the nutation angles of the pulses in the RF pulse train R(t).

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. These commands include the location, thickness and flip-angle of any RF pulses that are to be employed in the pulse sequence.

The pulse generator module 121 operates the system components to carry out the desired scan sequence. It produces data which indicates the timing, strength and shape of the RF pulses which are to be produced, and the timing and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
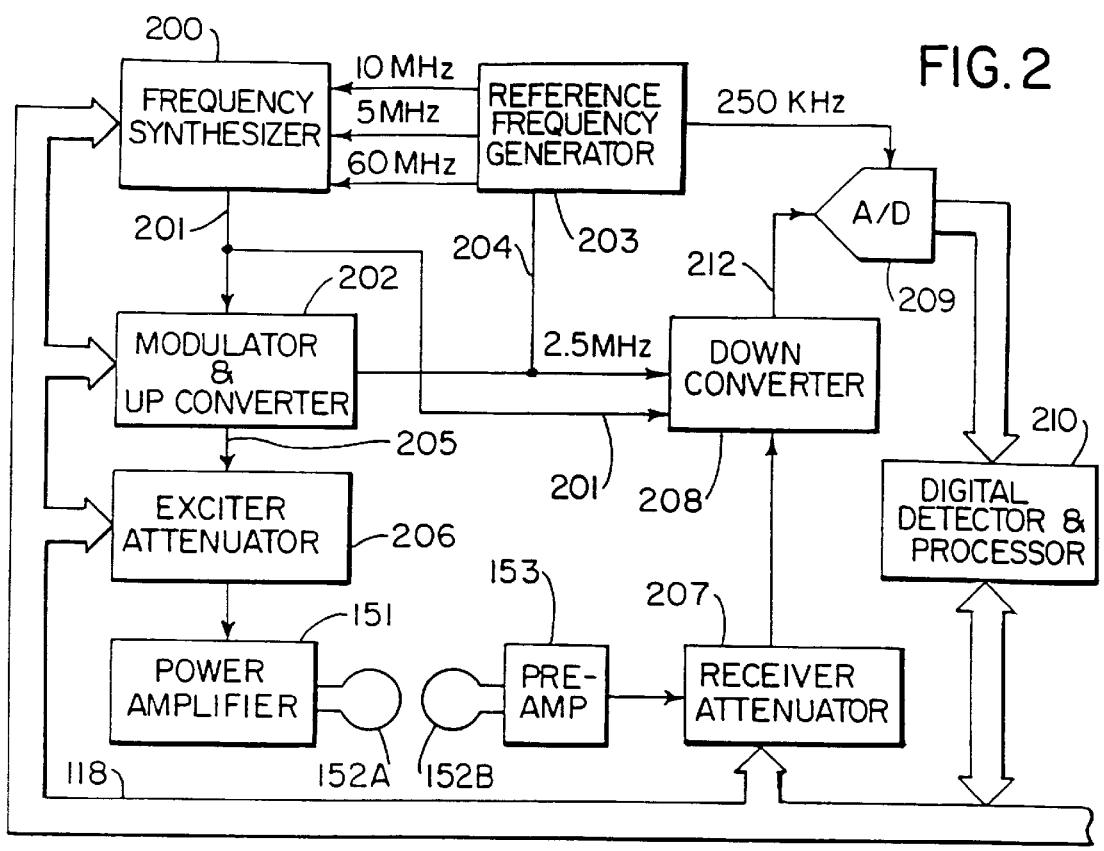
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced, and it is produced in the module 121 by sequentially reading out a series of stored digital values. It is the calculation of these stored digital values R(t) that is the subject of this invention. More particularly, it is one object of the present invention to produce the RF pulse envelope R(t) in real-time after the pulse sequence specification is entered from the operator console 100.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 Mhz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 Mhz reference signal as well as the 250 Khz sampling signal and the 5, 10 and 60 Mhz reference signals are produced by a reference frequency generator 203 from a common 20 Mhz master clock signal. For a more detailed description of the receiver, reference is made to U.S. Pat. No. 4,992,736 which is incorporated herein by reference.

In the preferred embodiment of the present invention the desired RF pulse prescribed by the operator is conveyed from the console 100 to the system control 122. The prescription is in the form of a desired flip-angle at specified locations. In response, the CPU module 119 executes a program according to the method of the present invention to calculate the values R(t) which are used by the pulse generator 121 and transceiver 150 to produce the desired RF pulse envelope.

Figure 3:
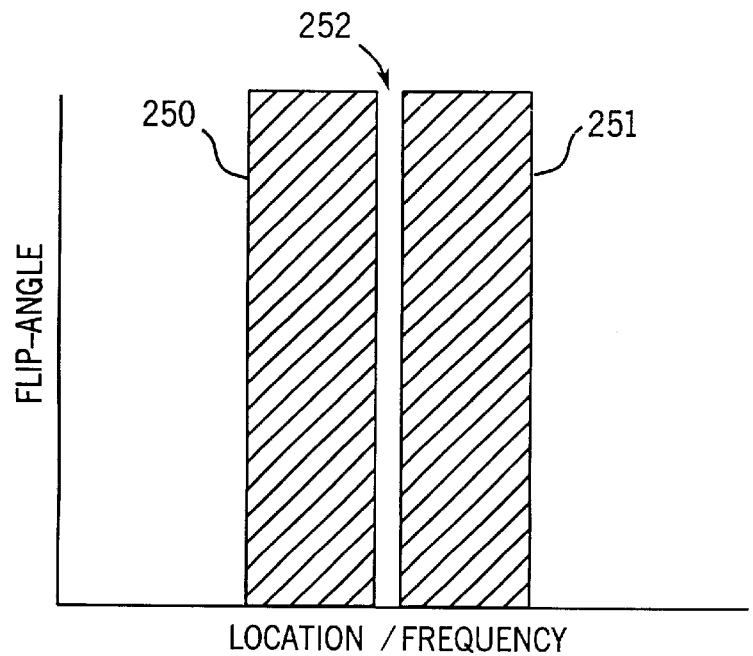
FIG. 3 is a graphical representation of an example pre-saturation RF pulse response profile input to the MRI system of FIG. 1.

Referring particularly to FIG. 3, for example, the pulse sequence may require a pair of 90° flip-angle saturation spins located on each side of a thin slab 252 from which image data is to be acquired. Ideally, the saturation pulses 250 and 251 apply a 90° flip-angle to spins located in slabs 10 mm thick (i.e. over a frequency range of 2 Khz and a gradient of 0.5 Gauss/cm), while spins in the imaging slab 252 remain unaffected.

Figure 4:
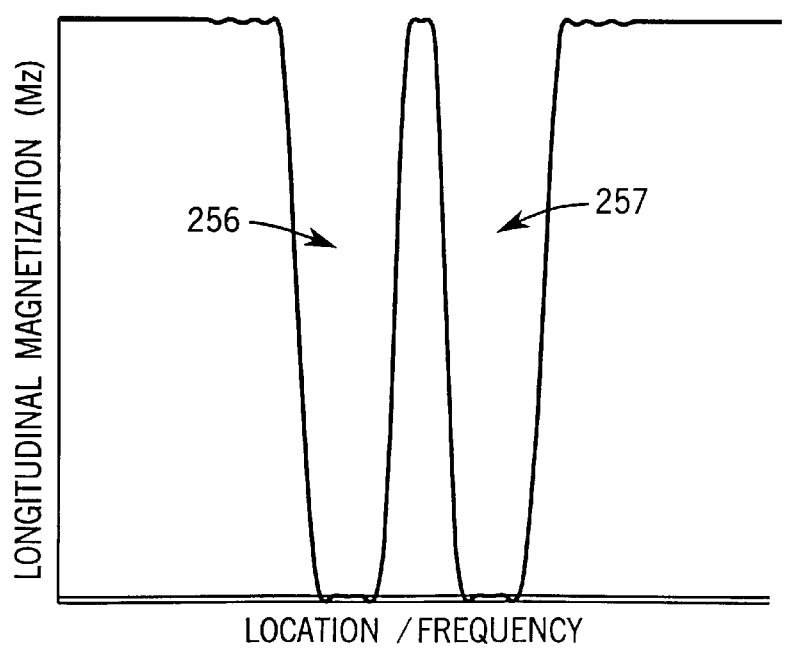
FIG. 4 is a graphic representation of the spin saturation achieved with the RF pulse envelope.

The RF pulse envelope R(t) required to meet this prescription is calculated using the present invention. As explained above, it is this waveform R(t) that is played out by the pulse generator 121 at the proper moments during the scan to produce the slabs of saturated spins shown at 256 and 257 in FIG. 4.

Figure 5:
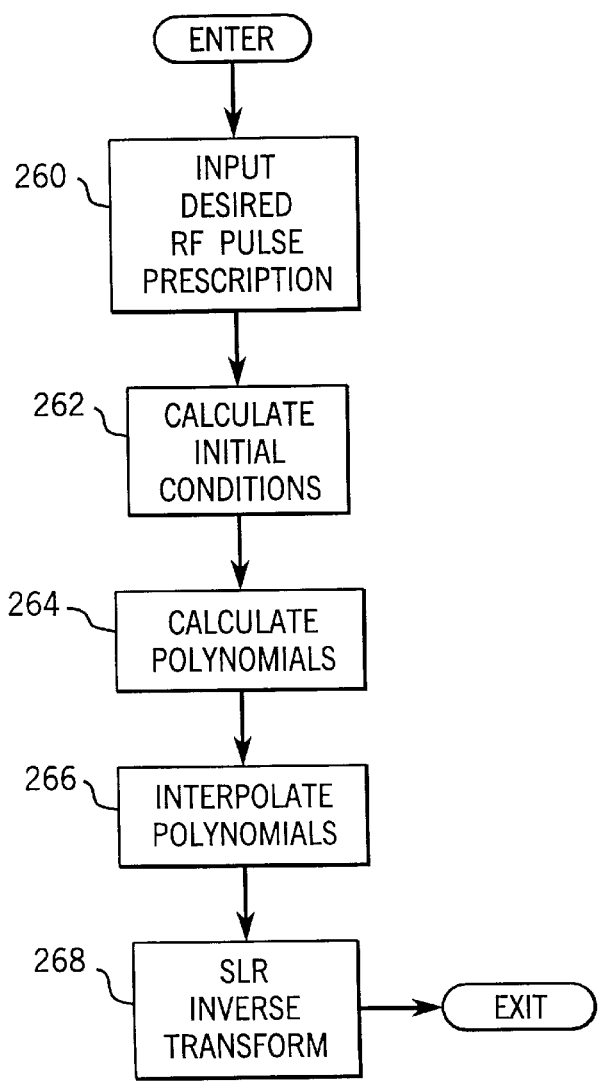
FIG. 5 is a flow chart of a program executed by the MRI system of FIG. 1 to produce an RF pulse envelope in response to an RF pulse response profile input by an operator.

Referring particularly to FIG. 5, the first step in the process is to input the frequency and flip-angle information which defines the prescribed RF pulse as indicated by process block 260. This information defines the function des($\omega$) in the above equations. The initial conditions are then calculated at process block 262 in accordance with equation (2) discussed above. As indicated at process block 264, the values for the SLR polynomials are then calculated using the weighted mean least-squares method as set forth above in equation (3). In the preferred embodiment, 32 order polynomials are calculated in all cases and then spline interpolation is employed in accordance with equation (6) at process block 266 to produce the desired number of values corresponding to the number of increments in the RF pulse envelope R(t). The A and B polynomials are then used to produce the incremental values in the RF pulse envelope R(t) by performing an inverse SLR transformation as indicated at process block 268 and described above in the above-referenced U.S. Pat. No. 4,940,940 and equation (7). The RF pulse envelope R(t) is then used in the scan according to the operator commands to produce the prescribed frequency selective or spatially selective RF profile.

Figure 6:
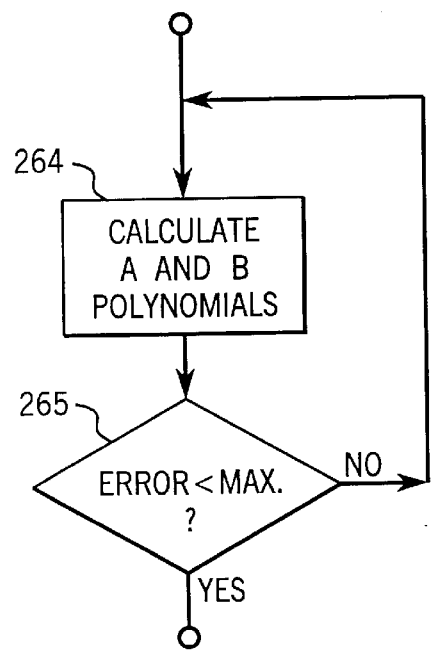
FIG. 6 is a flow chart which shows a modification to the program illustrated in FIG. 5.

In many cases the calculation of the SLR polynomials can be accomplished in one iteration. For example, it has been found that the presaturation pulse described above with reference to FIGS. 3 and 4 is accurately synthesized in a single iteration. However, in other cases the initial conditions are not sufficient to arrive at an accurate RF pulse envelope with the SLR polynomials produced by a single iteration. As shown in FIG. 6, in such cases a maximum allowed error is established, and after calculation of the SLR polynomials at process block 264, the resulting error is calculated and compared with the maximum at decision block 265. If the error is too large, the SLR polynomials are recalculated at process block 264 after adjusting the phase of the B($\omega$) term in equation (3) using the results from the previous iteration. Two or three iterations through process block 264 have produced satisfactory results in nearly all cases. The desired amplitude profile converges to an acceptable equiripple solution and the phase profile approximates the desired phase profile. Using this process, the desired amplitude profile along with a quadratic phase profile can, for example, be produced in two or three iterations.

While specific examples have been described, it should be apparent to those skilled in the art that the present invention can be employed to design a wide variety of RF pulses used in MRI and NMR spectroscopy. In many applications initial conditions can be calculated which enable the SLR polynomials to be calculated directly using a weighted least mean squares process. In other applications, for example when the phase profile is also specified, a number of iterations of the WLMS process may be required to converge on a satisfactory set of SLR polynomials. In any case, the SLR polynomials are transformed to an RF pulse envelope suitable for controlling the RF transmitter on an NMR instrument or MRI scanner.

I claim:

1. A method for producing an RF pulse envelope R(t) for use in controlling the RF transmitter on an NMR system, the steps comprising:

(a) inputting data des($\omega$) which indicates a desired pulse profile amplitude;

(b) calculating a weighting function W($\omega$);

(c) calculating a set of SLR polynomials using a single weighted least mean squares process, the desired pulse profile des($\omega$), and the weighting function W($\omega$); and (d) producing the RF pulse envelope R(t) by performing an inverse SLR transformation using the calculated SLR polynomials.

2. The method as recited in claim 1 in which the RF pulse envelope R(t) is used immediately in a pulse sequence performed by the NMR system to acquire NMR data from a subject.

3. The method as recited in claim 1 in which the input data des($\omega$) also indicates a desired phase and it includes the step of determining a phase error and repeating step (c) until the phase error is reduced below a preset maximum.

4. The method as recited in claim 1 in which the weighting function W($\omega$) is calculated as follows:

$$W(\omega) = (1 + 10 \, Wcor(\omega))/\bar{\delta}^2(\omega)$$

where:

$$Wcor(\omega) = \sum_i \frac{1}{|\omega - \omega_{oi}|^2}$$

$\delta(\omega)$=min-max error sought for a particular frequency, and $\omega_{oi}$=the frequency of the centers of transition bands in the desired pulse profile des($\omega$).

5. The method as recited in claim 1 in which the weighted least mean squares process is performed as follows:

$$\min J(B) = \int_0^{2\pi} W(\omega) \|B(\omega) - des(\omega)\|^2 d\omega$$

where:

$$B(\omega) = \sum_{i=0}^{i=n-1} b_i Z^{-1}$$

$$Z = e^{j\omega}$$

6. The method as recited in claim 1 which includes the step of inputting data indicating the desired phase profile $\phi(\omega)$, and step (c) is performed using this phase profile $\phi(\omega)$ data.

* * * * *